(12) United States Patent
Wang et al.

(10) Patent No.: US 8,227,288 B2
(45) Date of Patent: Jul. 24, 2012

(54) IMAGE SENSOR AND METHOD OF FABRICATING SAME

(75) Inventors: Wen-De Wang, Minsyong Township, Chiayi County (TW); Dun-Nian Yaung, Taipei (TW); Jen-Cheng Liu, Hsin-Chu (TW); Chun-Chieh Chuang, Tainan (TW); Jeng-Shyan Lin, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 173 days.

(21) Appl. No.: 12/413,752

(22) Filed: Mar. 30, 2009

(65) Prior Publication Data

US 2010/0244173 A1 Sep. 30, 2010

(51) Int. Cl.
*H01L 21/00* (2006.01)

(52) U.S. Cl. .................................. 438/72; 257/E31.122

(58) Field of Classification Search .................... 438/98, 438/72; 257/294, 435, 447, E31.122
See application file for complete search history.

(56) References Cited

U.S. PATENT DOCUMENTS

| | | | |
|---|---|---|---|
| 2006/0145176 A1* | 7/2006 | Lee | 257/98 |
| 2007/0063126 A1* | 3/2007 | Lee | 250/208.1 |
| 2008/0061330 A1* | 3/2008 | Shiau et al. | 257/294 |
| 2008/0157154 A1* | 7/2008 | Kim | 257/294 |
| 2008/0173963 A1* | 7/2008 | Hsu et al. | 257/431 |
| 2008/0246152 A1* | 10/2008 | Liu et al. | 257/758 |
| 2008/0308890 A1* | 12/2008 | Uya | 257/437 |
| 2009/0020838 A1* | 1/2009 | Lin et al. | 257/432 |

* cited by examiner

*Primary Examiner* — Matthew Landau
*Assistant Examiner* — Daniel Luke
(74) *Attorney, Agent, or Firm* — Haynes and Boone, LLP

(57) ABSTRACT

Provided is a method of fabricating an image sensor device. The method includes providing a device substrate having a front side and a back side. The method includes forming first and second radiation-sensing regions in the device substrate, the first and second radiation-sensing regions being separated by an isolation structure. The method also includes forming a transparent layer over the back side of the device substrate. The method further includes forming an opening in the transparent layer, the opening being aligned with the isolation structure. The method also includes filling the opening with an opaque material.

18 Claims, 13 Drawing Sheets

IMAGE SENSOR AND METHOD OF FABRICATING SAME

FIELD OF THE INVENTION

The present disclosure relates generally to a semiconductor device, and more particularly, to an image sensor device.

BACKGROUND

Semiconductor image sensors are used for sensing radiation such as light. Complementary metal-oxide-semiconductor (CMOS) image sensors (CIS) and charge-coupled device (CCD) sensors are widely used in various applications such as digital still camera or mobile phone camera devices. These devices utilize an array of pixels in a substrate, including photodiodes and transistors that can absorb radiation projected toward the substrate and convert the sensed radiation into electrical signals. However, an image sensor may generate noise when a pixel in the image sensor absorbs light that is intended for another pixel. This noise may be referred to as optical cross-talk, which may degrade the performance of the image sensor. In addition, the image sensor may include devices in a periphery region of the image sensor that need to be kept optically dark. These devices in the periphery region also suffer performance degradation and may generate noise when exposed to light. The aforementioned problems are particularly pronounced for a back side illuminated image sensor. Thus, while existing methods of fabricating image sensors have been generally adequate for their intended purposes, they have not been entirely satisfactory in every aspect.

SUMMARY

One of the broader forms of the present disclosure involves a method of fabricating an image sensor device that includes: providing a device substrate having a front side and a back side; forming first and second radiation-sensing regions in the device substrate, the first and second radiation-sensing regions being separated by an isolation structure; forming a transparent layer over the back side of the device substrate; forming an opening in the transparent layer, the opening being aligned with the isolation structure; and filling the opening with an opaque material.

Another of the broader forms of the present disclosure involves a method of fabricating an image sensor device that includes: providing a device substrate having a front side and a back side; forming a radiation-sensing region in the device substrate; forming a transparent layer over the back side of the device substrate; patterning the transparent layer to form a transparent feature that is substantially aligned with the radiation-sensing region and an opening that is adjacent to the transparent feature; and filling the opening with an opaque material.

Still another of the broader forms of the present disclosure involves an image sensor device that includes: a device substrate having a front side and a back side; a radiation-sensing region formed in the device substrate; a transparent feature formed over the back side of the device substrate, the transparent feature being aligned with the radiation-sensing region; and an opaque feature formed over the back side of the device substrate and adjacent to the transparent feature; wherein a surface of the transparent feature and a surface of the opaque feature are substantially co-planar, and wherein the image sensor device includes a pixel region, a periphery region, and a bonding pad region.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
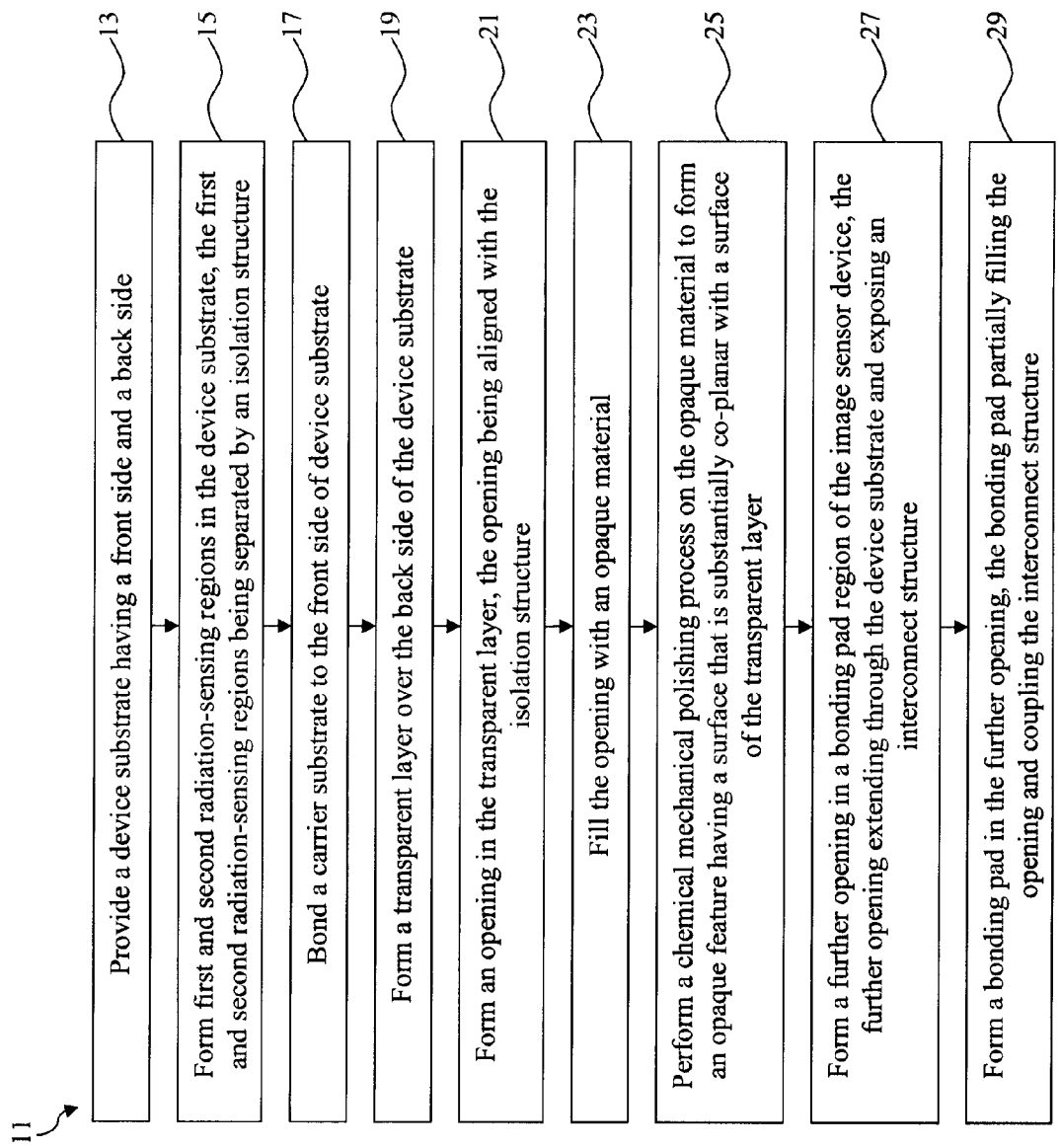
FIG. 1 is a flowchart illustrating a method for fabricating a semiconductor device according to various aspects of the present disclosure.

Illustrated in FIG. 1 is a flowchart of a method 11 for fabricating a back-side illuminated (BSI) image sensor device that has reduced optical cross-talk according to various aspects of the present disclosure. Referring to FIG. 1, the method 11 begins with block 13 in which a device substrate having a front side and a back side is provided. The method 11 continues with block 15 in which first and second radiation-sensing regions are formed in the device substrate, the first and second radiation-sensing regions being separated by an isolation structure. The method 11 continues with block 17 in which a carrier substrate is bonded to the front side of the device substrate. The method 11 continues with block 19 in which a transparent layer is formed over the back side of the device substrate. The method 11 continues with block 21 in which an opening is formed in the transparent layer, the opening being aligned with the isolation structure. The method 11 continues with block 23 in which the opening is filled with an opaque material. The method 11 continues with block 25 in which a chemical mechanical polishing process is performed on the opaque material to form an opaque feature having a surface that is substantially co-planar with a surface of the transparent layer. The method 11 continues with block 27 in which a further opening is formed in a bonding pad region of the image sensor device, the further opening extending through the device substrate and exposing an interconnect structure. The method 11 continues with block 29 in which a bonding pad is formed in the further opening, the bonding pad partially filling the opening and coupling the interconnect structure.

FIGS. 2 to 11 are diagrammatic fragmentary sectional side views of various embodiments of an apparatus that is a BSI image sensor device 30 at various stages of fabrication according to the method 11 of FIG. 1. The image sensor device 30 includes an array or grid of pixels for sensing and recording an intensity of radiation (such as light) directed toward a back-side of the image sensor device 30. The image sensor device 30 may include a charge-coupled device (CCD), complimentary metal oxide semiconductor (CMOS) image sensor (CIS), an active-pixel sensor (APS), or a passive-pixel sensor. The image sensor device 30 further includes additional circuitry and input/outputs that are provided adjacent to the grid of pixels for providing an operation environment for the pixels and for supporting external communication with the pixels. It is understood that FIGS. 2 to 11 have been simplified for a better understanding of the inventive concepts of the present disclosure and may not be drawn to scale.

Figure 2:
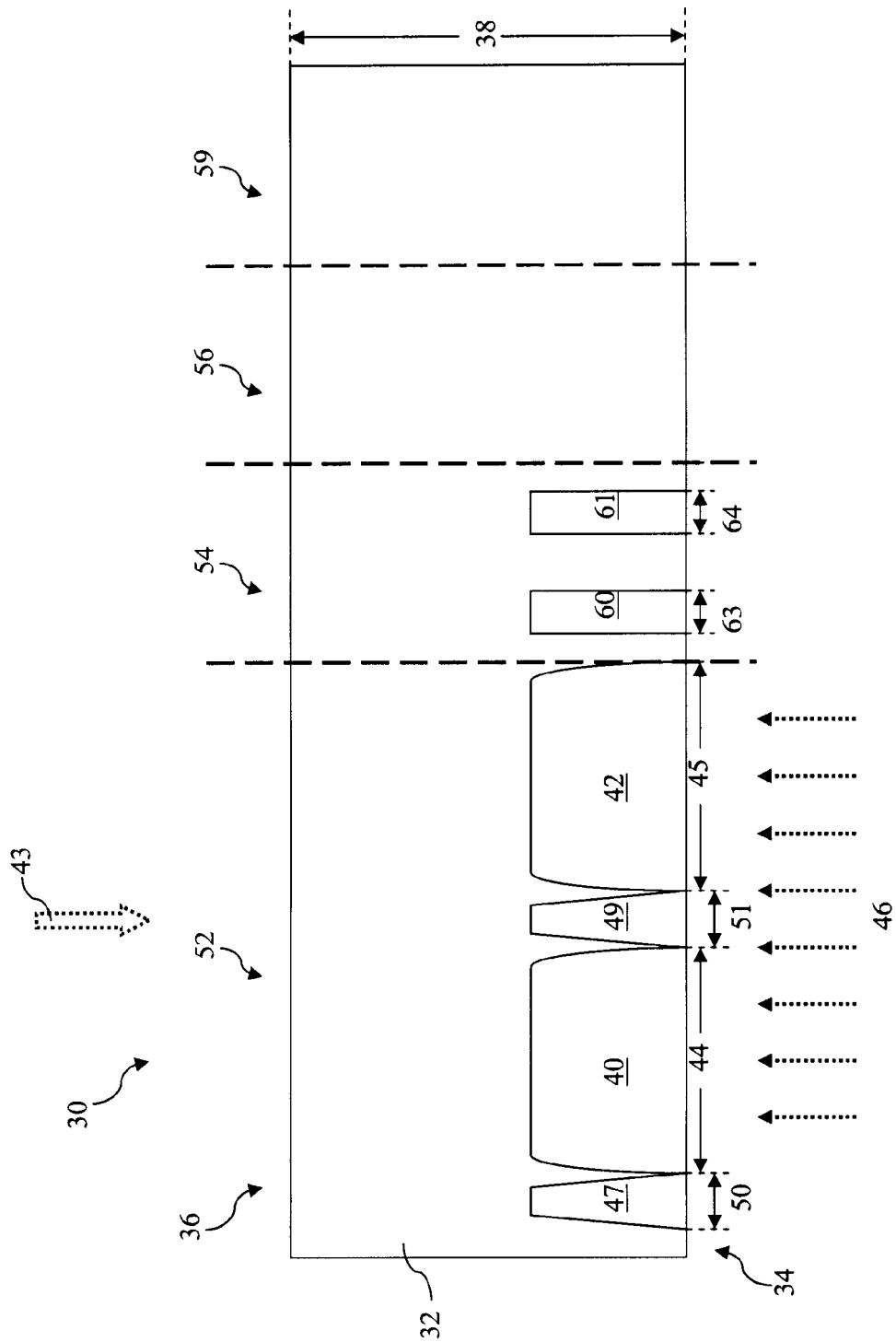
FIGS. 2-13 are diagrammatic fragmentary sectional side views of the semiconductor device at various stages of fabrication in accordance with the method illustrated in FIG. 1.

With reference to FIG. 2, the image sensor device 30 includes a device substrate 32. The device substrate 32 is a silicon substrate doped with a p-type dopant such as boron (for example a p-type substrate). Alternatively, the device substrate 32 could be another suitable semiconductor material. For example, the device substrate 32 may be a silicon substrate that is doped with an n-type dopant such as phosphorous or arsenic (an n-type substrate). The device substrate 32 could include other elementary semiconductors such as germanium and diamond. The device substrate 32 could optionally include a compound semiconductor and/or an alloy semiconductor. Further, the device substrate 32 could include an epitaxial layer (epi layer), may be strained for performance enhancement, and may include a silicon-on-insulator (SOI) structure. Referring back to FIG. 2, the device substrate 32 has a front side 34 and a back side 36. The device substrate 32 also has an initial thickness 38 that is in a range from about 100 microns (um) to about 3000 um. In the present embodiment, the initial thickness 38 is about 750 um.

Radiation-sensing regions—for example, pixels 40 and 42—are formed in the device substrate 32. The pixels 40 and 42 are operable to sense radiation, such as an incident light 43 (thereafter referred to as light 43), that is projected toward the back side 36 of the device substrate 32. The pixels 40 and 42 each include a photodiode in the present embodiment. In other embodiments, the pixels 40 and 42 may include pinned layer photodiodes, photogates, reset transistors, source follower transistors, and transfer transistors. The pixels 40 and 42 have widths 44 and 45, respectively. The widths 44 and 45 are in a range from about 0.5 um to about 7.0 um, for example about 1.1 um in the present embodiment. In other embodiments, the widths 44 and 45 may or may not be equal to each other and may have values different than 1.1 um. Further, the pixels 44 and 45 may be varied from one another to have different junction depths, thicknesses, and so forth. For the sake of simplicity, only two pixels 40 and 42 are illustrated in FIG. 2, but it is understood that any number of radiation-sensing regions may be implemented in the device substrate 32. Referring back to FIG. 2, the pixels 40 and 42 are formed by performing an implantation process 46 on the device substrate 32. The implantation process 44 includes doping the device substrate 32 with a p-type dopant such as boron. In an alternative embodiment, the implantation process 46 may include doping the device substrate 32 with an n-type dopant such as phosphorous or arsenic.

Referring back to FIG. 2, the device substrate 32 includes isolation structures—for example, isolation structures 47 and 49—that provide electrical and optical isolation between the pixels 40 and 42. The isolation structures 47 and 49 include shallow trench isolation (STI) structures that are formed of a dielectric material such as silicon oxide or silicon nitride. In other embodiments, the isolation structures 47 and 49 may include doped isolation features, such as heavily doped n-type regions. The isolation structures 47 and 49 have widths 50 and 51, respectively. The widths 50 and 51 are in a range from about 0.05 um to about 3.0 um, for example about 0.1 um in the present embodiment—relatively small compared to the widths 44 and 45 of the pixels 40 and 42, respectively.

The performance of the image sensor device 30 depends in part upon an amount of radiation absorbed by the pixels 40 and 42. A pixel having a larger width has better radiation absorption capabilities. Meanwhile, an overall width (or size) of the image sensor device 30 is typically fixed by design requirements, and the overall width of the image sensor device 30 is largely made up of a sum of the widths of the pixels and the isolation structures. Hence, it is desirable to reduce or shrink the width of the isolation structures (such as isolation structures 47 and 49) and increase the width of the pixels (such as pixels 40 and 42), so that the image sensor device 30 has a wider radiation-sensing region for a given width of the image sensor device 30 and thus better performance. Hence, the isolation structures 47 and 49 have relatively small widths 50 and 51, respectively, compared to the widths 44 and 45 of the pixels 40 and 42, respectively.

For the sake of simplicity, only two isolation structures 47 and 49 are illustrated in FIG. 2, but it is understood that any number of isolation structures may be implemented in the device substrate 32 so that the radiation-sensing regions such as pixels 40 and 42 may be properly isolated. It is also understood that the particular values of the widths of the radiation-sensing regions and the isolation structures in the present disclosure are mere examples and that widths having other values may be implemented depending on the type of application and design requirements of the image sensor device 30.

Still referring to FIG. 2, the pixels 40 and 42 and isolation structures 47 and 49 are formed in a region of the image sensor device 30 referred to as a pixel region 52. The image sensor 30 also includes a periphery region 54, a bonding pad region 56, and a scribe line region 59. The dashed lines in FIG. 2 designate the boundaries between the regions 52, 54, 56, and 59. The periphery region 54 includes devices 60 and 61 that need to be kept optically dark. For example, the device 60 in the present embodiment may be a digital device, such as an application-specific integrated circuit (ASIC) device or a system-on-chip (SOC) device. The device 61 may be a reference pixel that is used to establish a baseline of an intensity of light for the image sensor device 30. The devices 60 and 61 may suffer performance degradation and/or may generate noise when exposed to the light 43. For example, if the device 60 is a digital device that is illuminated by light (such as the light 43), the photons within the light may activate electrons in active regions of the digital device 60 (such as source and drain regions) due to a photoelectric effect. The electrons may generate noise or leakage current which degrades the performance of the digital device 60. Therefore, it is desirable to keep parts of the periphery region 54 overlying the devices 60 and 61 optically dark. Methods and structures employed to ensure the darkness of the parts of the periphery region 54 will be discussed in detail later. Referring back to FIG. 2, the device 60 has a width 63 that is in a range from about 1 um to about 1000 um, and the device 61 has a width 64 that is in a range from about 0.5 um to about 1000 um. These ranges are merely exemplary, however, and the widths 63 and 64 may have different ranges in other embodiments.

Referring back to FIG. 2, the bonding pad region 56 includes a region where one or more bonding pads (not illustrated) of image sensor device 30 will be formed in a later processing stage, so that electrical connections between the image sensor device 30 and outside devices may be established. The scribe line region 59 includes a region that separates one semiconductor die (for example, a semiconductor die that includes the bonding pad region 56, the periphery region 54, and the pixel region 52) from an adjacent semiconductor die (not illustrated). The scribe line region 59 is cut therethrough in a later fabrication process to separate adjacent dies before the dies are packaged and sold as integrated circuit chips. The scribe line region 59 is cut in such a way that the semiconductor devices in each die are not damaged. It is also understood that these regions 52-59 extend vertically above and below the device substrate 32.

Figure 3:
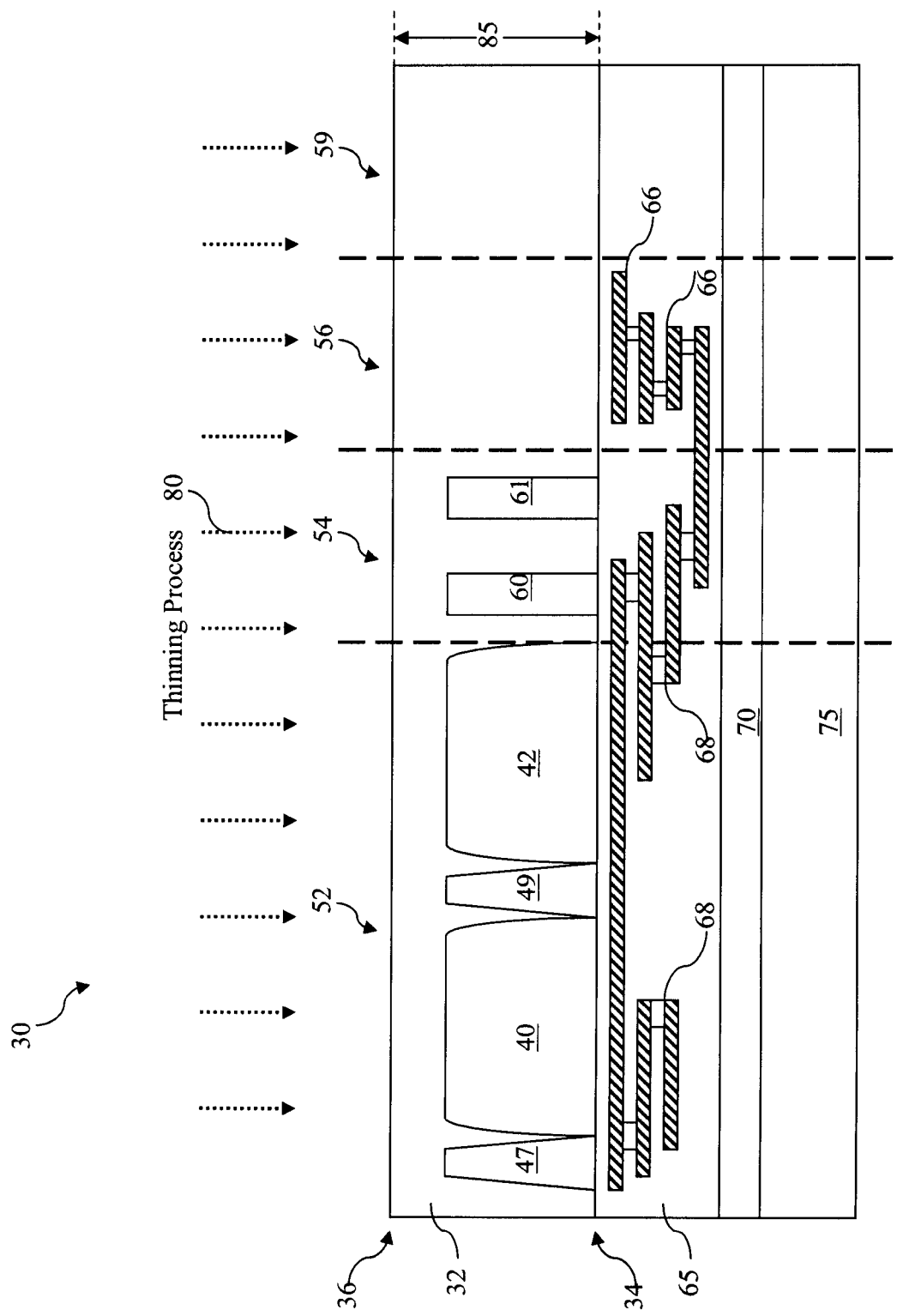

Referring now to FIG. 3, an interconnect structure 65 is formed over the front side 34 of the device substrate 32. The interconnect structure 65 includes a plurality of patterned dielectric layers and conductive layers that provide interconnections (e.g., wiring) between the various doped features, circuitry, and input/output of the image sensor device 30. The interconnect structure 65 includes an interlevel dielectric (ILD) and a multilayer interconnect (MLI) structure. The MLI structure includes contacts, vias and metal lines. For the purposes of illustration, a plurality of conductive lines 66 and vias/contacts 68 are shown in FIG. 3, it being understood that the conductive lines 66 and vias/contacts 68 illustrated are merely exemplary, and the actual positioning and configuration of the conductive lines 66 and vias/contacts 68 may vary depending on design needs.

The MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD) (or sputtering), chemical vapor deposition (CVD), atomic layer deposition (ALD), or combinations thereof. Other manufacturing techniques to form the aluminum interconnect may include photolithography processing and etching to pattern the conductive materials for vertical connection (for example, vias/contacts 68) and horizontal connection (for example, conductive lines 68). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

Still referring to FIG. 3, a buffer layer 70 is formed on the interconnect structure 65. In the present embodiment, the buffer layer 70 includes a dielectric material such as silicon oxide. Alternatively, the buffer layer 70 may optionally include silicon nitride. The buffer layer 70 is formed by CVD, PVD, or other suitable techniques. The buffer layer 70 is planarized to form a smooth surface by a chemical mechanical polishing (CMP) process. Thereafter, a carrier substrate 75 is bonded with the device substrate 32 through the buffer layer 70, so that processing the back side 36 of the device substrate 32 can be performed. The carrier substrate 75 in the present embodiment is similar to the substrate 32 and includes a silicon material. Alternatively, the carrier substrate 75 may include a glass substrate or another suitable material. The carrier substrate 75 may be bonded to the device substrate 32 by molecular forces—a technique known as direct bonding or optical fusion bonding—or by other bonding techniques known in the art, such as metal diffusion or anodic bonding. Referring back to FIG. 3, the buffer layer 70 provides electrical isolation between the device substrate 32 and the carrier substrate 75. The carrier substrate 75 provides protection for the various features formed on the front side 34 of the device substrate 32, such as the pixels 40 and 42. The carrier substrate 75 also provides mechanical strength and support for processing the back side 36 of the device substrate 32 as discussed below.

After bonding, the device substrate 32 and the carrier substrate 75 may optionally be annealed to enhance bonding strength. Referring back to FIG. 3, a thinning process 80 is performed to thin the device substrate 32 from the backside 36. The thinning process 80 may include a mechanical grinding process and a chemical thinning process. A substantial amount of substrate material may be first removed from the device substrate 32 during the mechanical grinding process. Afterwards, the chemical thinning process may apply an etching chemical to the back side 36 of the device substrate 32 to further thin the device substrate 32 to a thickness 85. In the present embodiment, the thickness 85 is less than about 5 um. It is also understood that the particular thicknesses disclosed in the present disclosure are mere examples and that other thicknesses may be implemented depending on the type of application and design requirements of the image sensor device 30.

Figure 4:
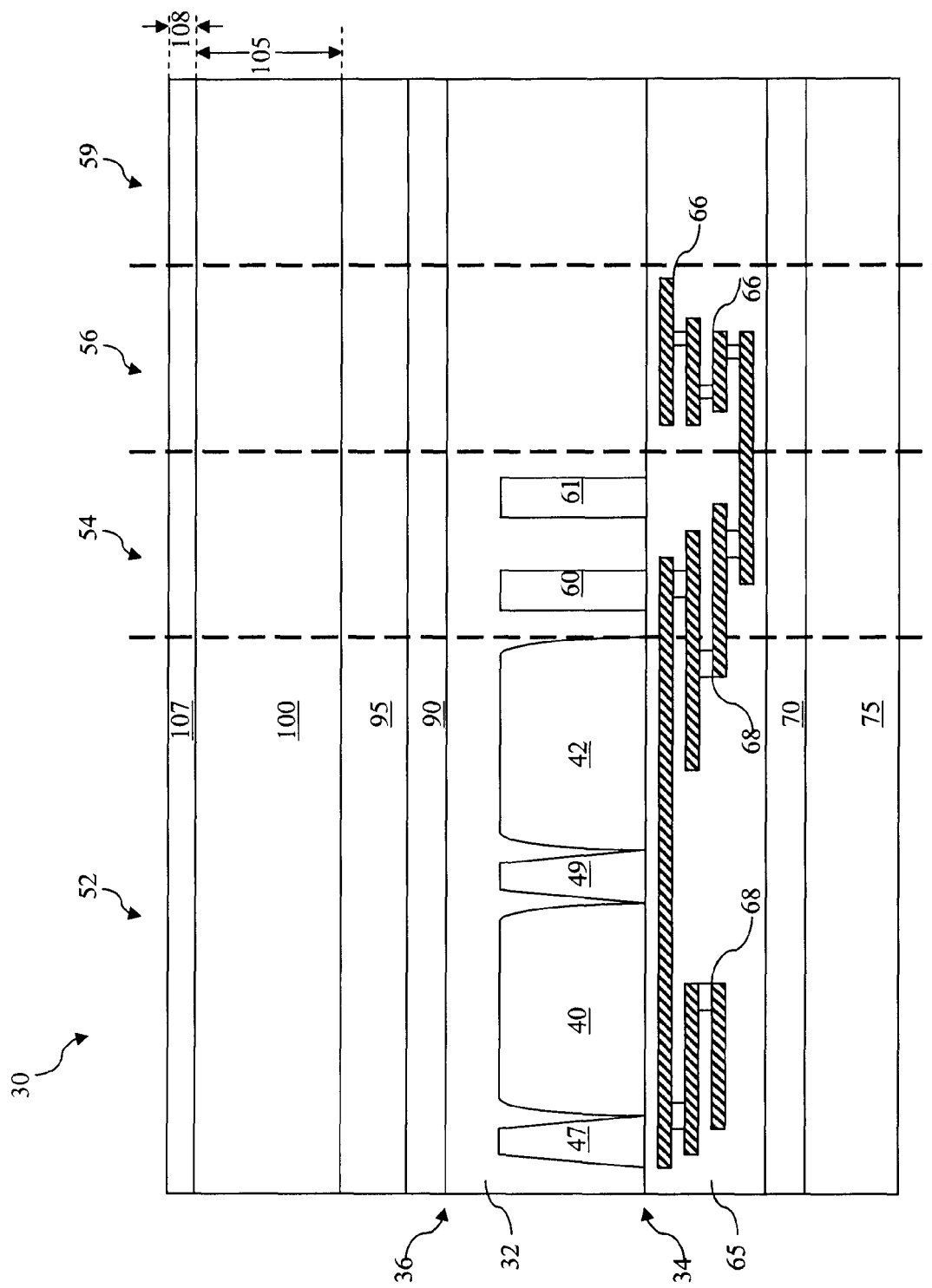

Referring now to FIG. 4, a transparent layer 90 may optionally be formed over the back side 36 of the device substrate 32. The transparent layer 90 may include silicon oxide and may be formed by a suitable technique known in the art, such as CVD, PVD, ALD, or combinations thereof. A bottom anti-reflective (BARC) layer 95 may then be optionally formed over the transparent layer 90 by a suitable technique known in the art, such as CVD, PVD, ALD, or combinations thereof. Thereafter, a transparent layer 100 is formed over the BARC layer 95. The transparent layer 100 includes silicon oxide and is formed by a suitable technique known in the art, such as CVD, PVD, ALD, or combinations thereof. The transparent layer 100 also has a thickness 105, which is in a range from about 500 Angstroms to about 5000 Angstroms in the present embodiment. In other embodiments, the transparent layer 100 may include another suitable transparent material and may have a different value for the thickness 105. Referring back to FIG. 4, an ARC layer 107 is formed over the transparent layer 100 by a suitable technique in the art, such as CVD, PVD, ALD, or combinations thereof. The ARC layer 107 includes silicon oxy-nitride and has a thickness that is in a range from about 300 Angstroms to about 500 Angstroms. The ARC layer 107 may help reduce reflection of a light used during a subsequent photolithography process.

Figure 5:
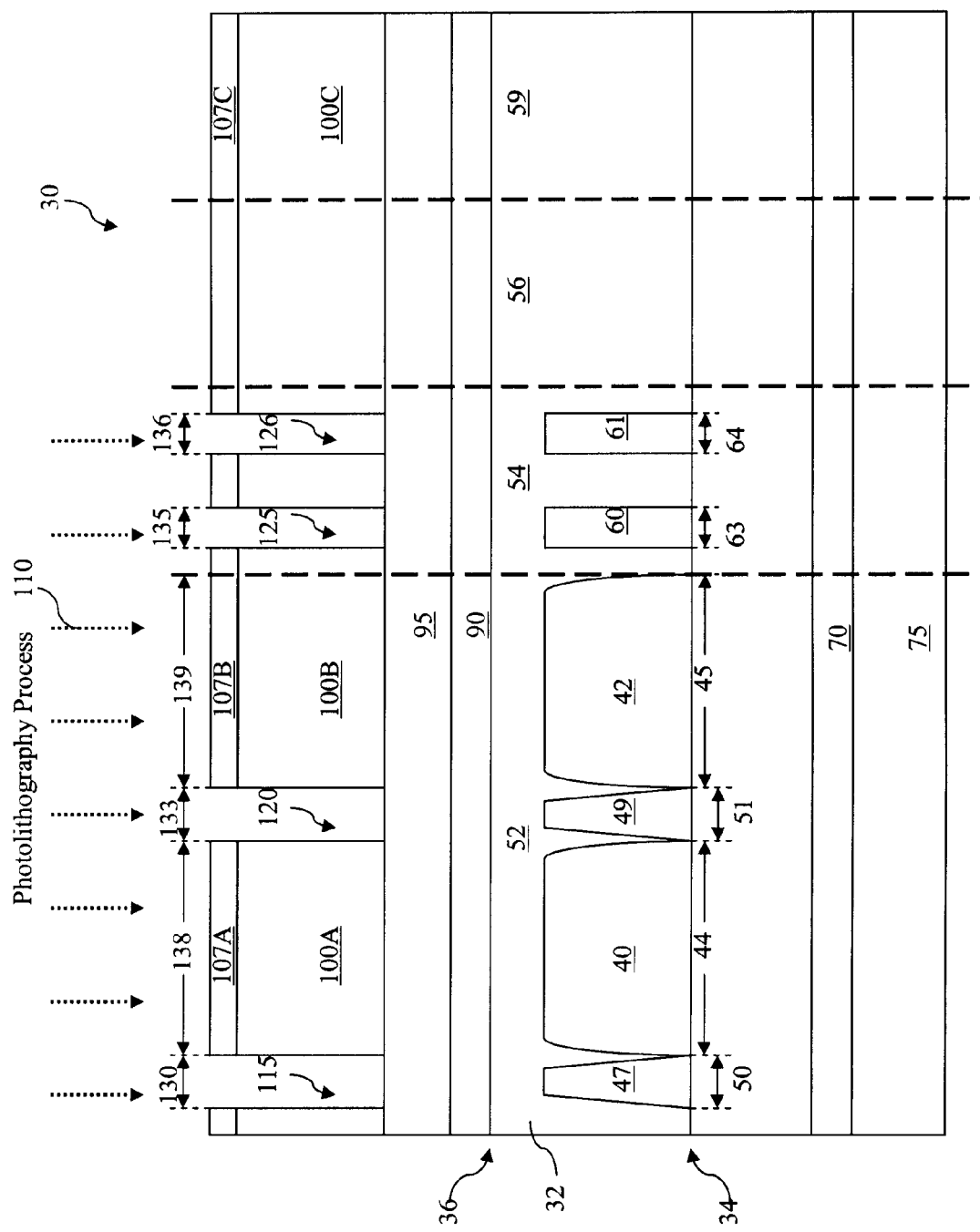

Next, the transparent layer 100 is patterned to form openings. FIG. 5 illustrates forming openings in the transparent layer 100 according to a present embodiment of the disclosure. Referring now to FIG. 5, a photolithography process 110 is performed on the ARC layer 107 and the transparent layer 100 therebelow. The photolithography process 110 includes forming a photoresist layer (not illustrated) on the ARC layer 107 and the transparent layer 100 therebelow and performing various masking, exposing, baking, and rinsing processes to form a patterned photoresist mask (not illustrated). The patterned photoresist mask protects portions of the ARC layer 107 and the transparent layer 100 therebelow in another etching process to form openings 115, 120, 125, and 126 that each extends vertically through the ARC layer 107 and the transparent layer 100 completely. It is understood that the photoresist mask is stripped away after the openings 115, 120, 125, and 126 are formed.

Referring back to FIG. 5, the openings 115, 120, 125, and 126 have widths 130, 133, 135, and 136, respectively. The openings 115 and 120 are aligned with the isolation structures 47 and 49, respectively, and the widths 130, 133 of the openings 115, 120 are approximately equal to the widths 50 and 51, respectively. Recall from the discussions of FIG. 2 that the widths 50 and 51 are approximately equal to 0.1 um. Thus, the widths 130 and 133 are approximately equal to 0.1 um, which is a relatively small dimension and may push the photolithography process 110 closer to its limits. For example, to form openings 115 and 120 as small as 0.1 um, the tools used in the photolithography process 110 need to have relatively high precision and as such may be costly. For example, a fairly expensive 193 nanometer (nm) tool may be needed to form the openings 115 and 120. The openings 125 and 126 are aligned with the devices 60 and 61 within the periphery region 54, respectively, and the widths 135, 136 of the openings 125, 126, respectively, are greater or equal to widths 63 and 64 of the devices 60 and 61, respectively.

Still referring to FIG. 5, portions of the transparent layer 100 remaining after the photolithography process 110 is performed may be referred to as transparent features 100A, 100B, and 100C. (Similarly, the ARC layer 107 is divided into portions 107A, 107B, and 107C). The transparent features 100A and 100B have widths 138 and 139, respectively. In the embodiment shown in FIG. 5, the transparent features 100A and 100B are aligned with the pixels 40 and 42, respectively, and the widths 138, 139 of the transparent features 100A, 100B are approximately equal to the widths 44 and 45 of the pixels 40 and 42, respectively. Recall from the discussions of FIG. 2 that the widths 44 and 45 are approximately equal to 1.1 um in the present embodiment. Thus, the widths 138 and 139 are approximately equal to 1.1 um. For the sake of simplicity and clarity, the conductive lines 68 and the vias/contacts in the interconnect structure 65 are not illustrated in FIG. 5.

Figure 6:
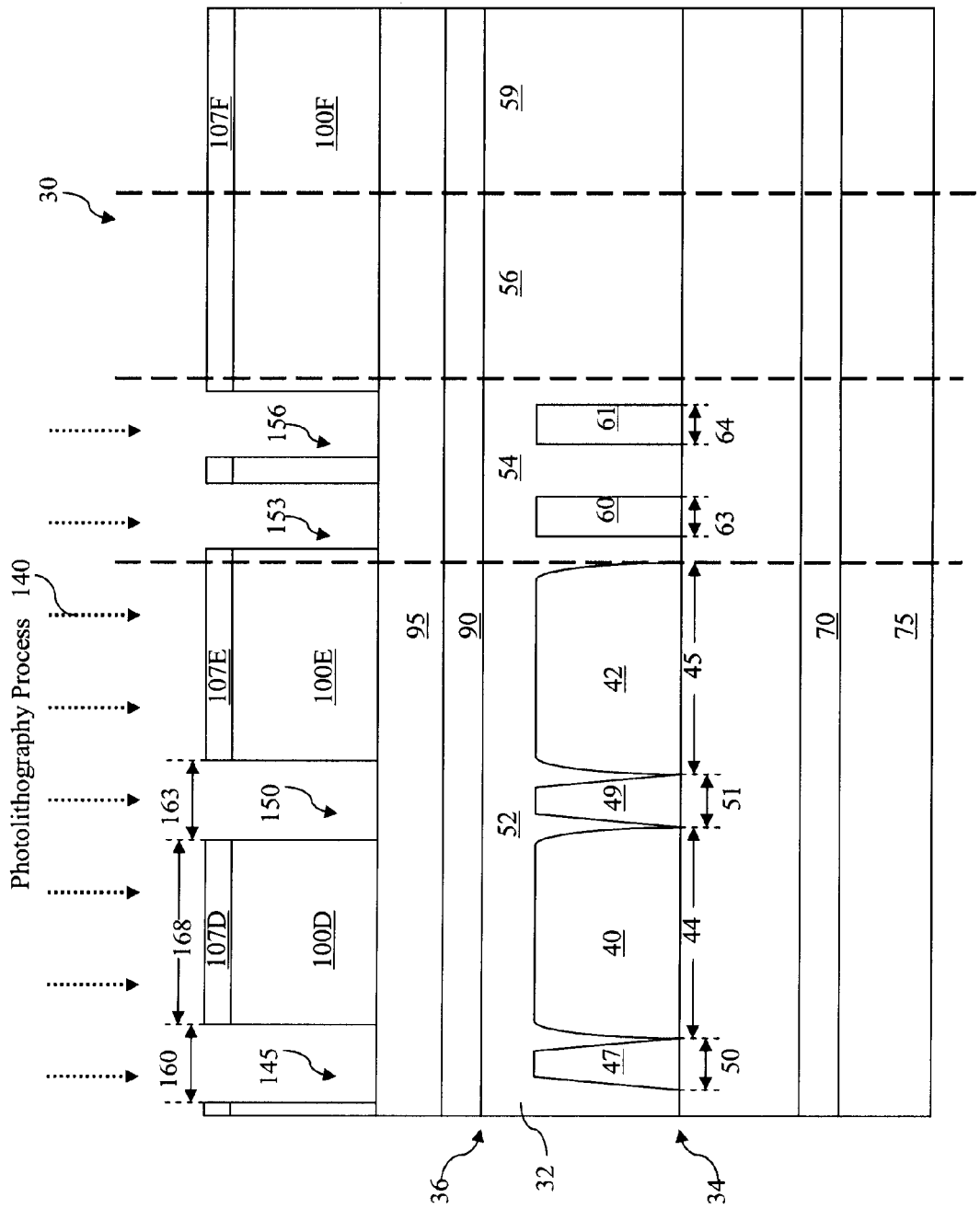
Figure 7:
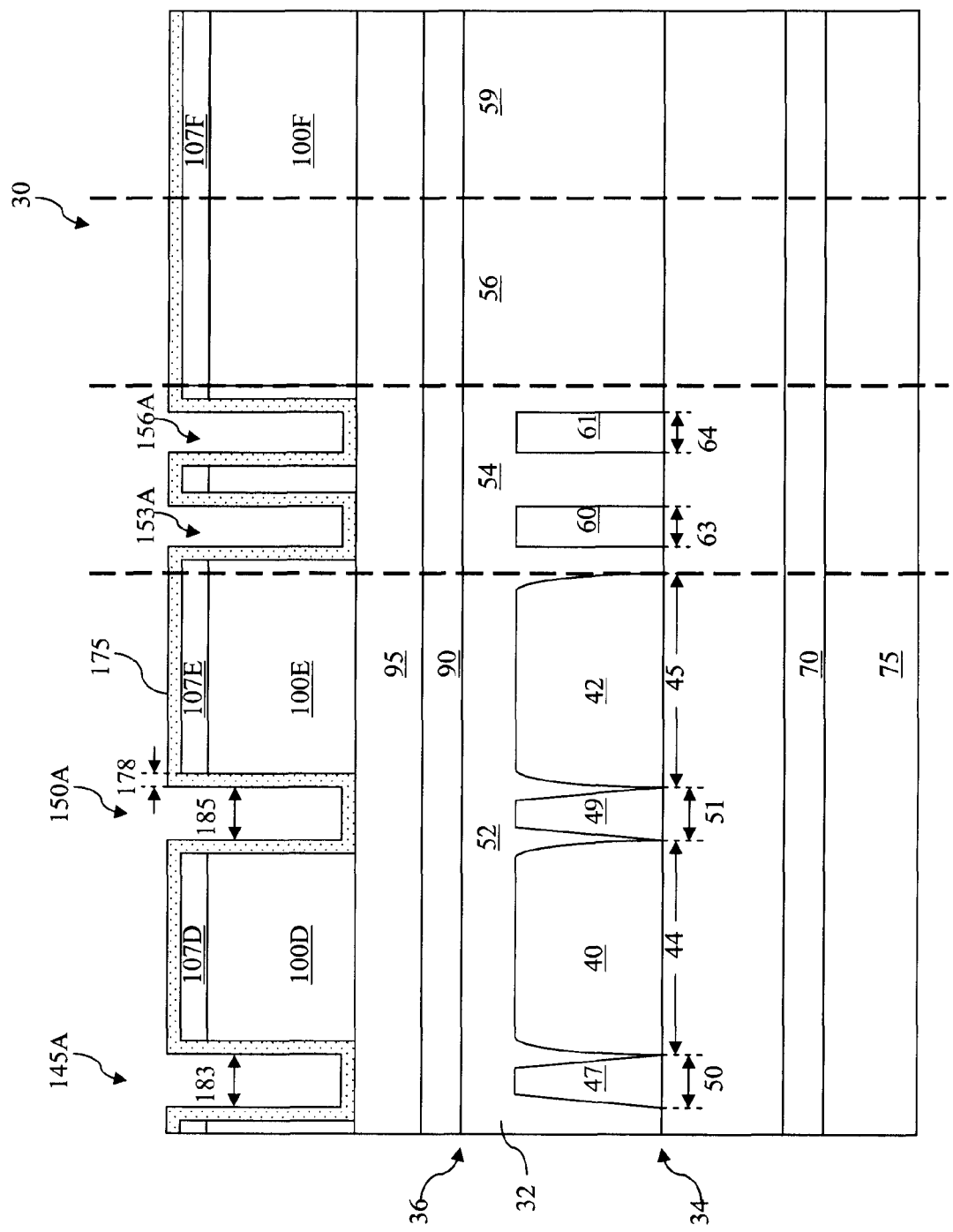

FIGS. 6 and 7 illustrate forming openings in the transparent layer 100 according to an alternative embodiment of the disclosure. Referring now to FIG. 6, a photolithography process 140 is performed on the ARC layer 107 and the transparent layer 100 therebelow. The photolithography process 140 includes processes that are similar to the processes included in the photolithography process 110 and patterns a photoresist mask (not illustrated) that is then used to pattern the ARC layer 107 and the transparent layer 100 to form openings 145, 150, 153, and 156 that each extends vertically through the transparent layer 100. The openings 145 and 150 have widths 160 and 163, respectively. The openings 145 and 150 are aligned with the isolation structures 47 and 49, but the widths 160 and 163 of the openings 145 and 150 are greater than the widths 50 and 51, respectively. In the embodiment shown in FIG. 6, the widths 160 and 163 are approximately equal to 0.16 um. To form openings 145 and 150 having widths approximately equal to 0.16 um, the tools used in the photolithography process 140 need not have precision as high as the tools used in the photolithography process 110 and as such may be less expensive. For example, a 248 nm tool (which is cheaper than a 193 nm tool) may be used in the photolithography process 140 to form the openings 145 and 150.

Still referring to FIG. 6, portions of the transparent layer 100 remaining after the photolithography process 140 is performed may be referred to as transparent features 100D, 100E, and 100F. The transparent feature 100D has a width 168 and is aligned with the pixel 40, but the width 168 of the transparent features 100D is smaller than the width 44 of the pixel 40. In the embodiment shown in FIG. 6, the width 168 is approximately equal to 1.04 um. Note that the openings 153 and 156 formed in the periphery region 54 are aligned with the devices 60 and 61 but have wider widths than the devices 60 and 61.

Referring now to FIG. 7, a transparent material 175 is conformally formed on the transparent features 100D, 100E, 100F and partially fills the openings 145, 150, 153 and 156. Since the periphery region 54 is protected by the photoresist mask 142, no transparent material 175 is formed in the periphery region 54. The transparent material 175 includes silicon oxide and is formed by a deposition process known in the art, such as CVD, PVD, ALD, or combinations thereof. The transparent material 175 has a thickness 178, which is approximately equal to 0.03 um in the embodiment shown in FIG. 7. Thus, the openings 145, 150, 153, and 156 are reduced to smaller openings 145A, 150A, 153A, and 156A respectively. The openings 145A and 150A have widths 183 and 185, respectively. The widths 183 and 185 are approximately equal to 0.1 um (0.16 um−0.03 um−0.03 um=0.1 um) in the embodiment shown in FIG. 7. Recall from the discussions of FIG. 5 that the openings 115 and 120 have widths 130 and 133 that are approximately equal to 0.1 um—which is substantially the same size as the widths 183 and 185 of the openings 145A and 145B. Therefore, the embodiment illustrated in FIGS. 6 and 7 discloses an alternative method to form a relatively small opening, the width (or size) of which is driven by design needs but is limited by fabrication capabilities and cost considerations. Compared to the embodiment shown in FIG. 5, the embodiment illustrated in FIGS. 6 and 7 forms openings that are substantially the same size as the openings in FIG. 5 by incorporating an extra deposition process while using a cheaper photolithography tool having less precision. It is understood that the photoresist mask 142 is removed by a stripping or ashing process known in the art before the fabrication of the image sensor device 30 continues.

Note that in the embodiment shown in FIG. 7, the widths 63 and 64 of the devices 60 and 61, respectively, are sufficiently large so that the openings 125 and 126 may be formed by using a cheaper photolithography tool (such as the 248 nm tool). Thus the transparent material 175 need not be formed in the periphery region 54 to reduce the openings 125 and 126. It is understood, however, that in embodiments where the widths 63 and 64 of the devices 60 and 61, respectively, are too small to be formed by a cheaper photolithography tool (such as the 248 nm tool), then the photoresist mask 142 is not formed to protect the periphery region 54, and that the transparent material 175 can be formed in the periphery region 54 to reduce the openings 125 and 126 down to a desired width (or size). For the sake of simplicity and clarity, the conductive lines 68 and the vias/contacts in the interconnect structure 65 are not illustrated in FIGS. 6-7.

Figure 8:
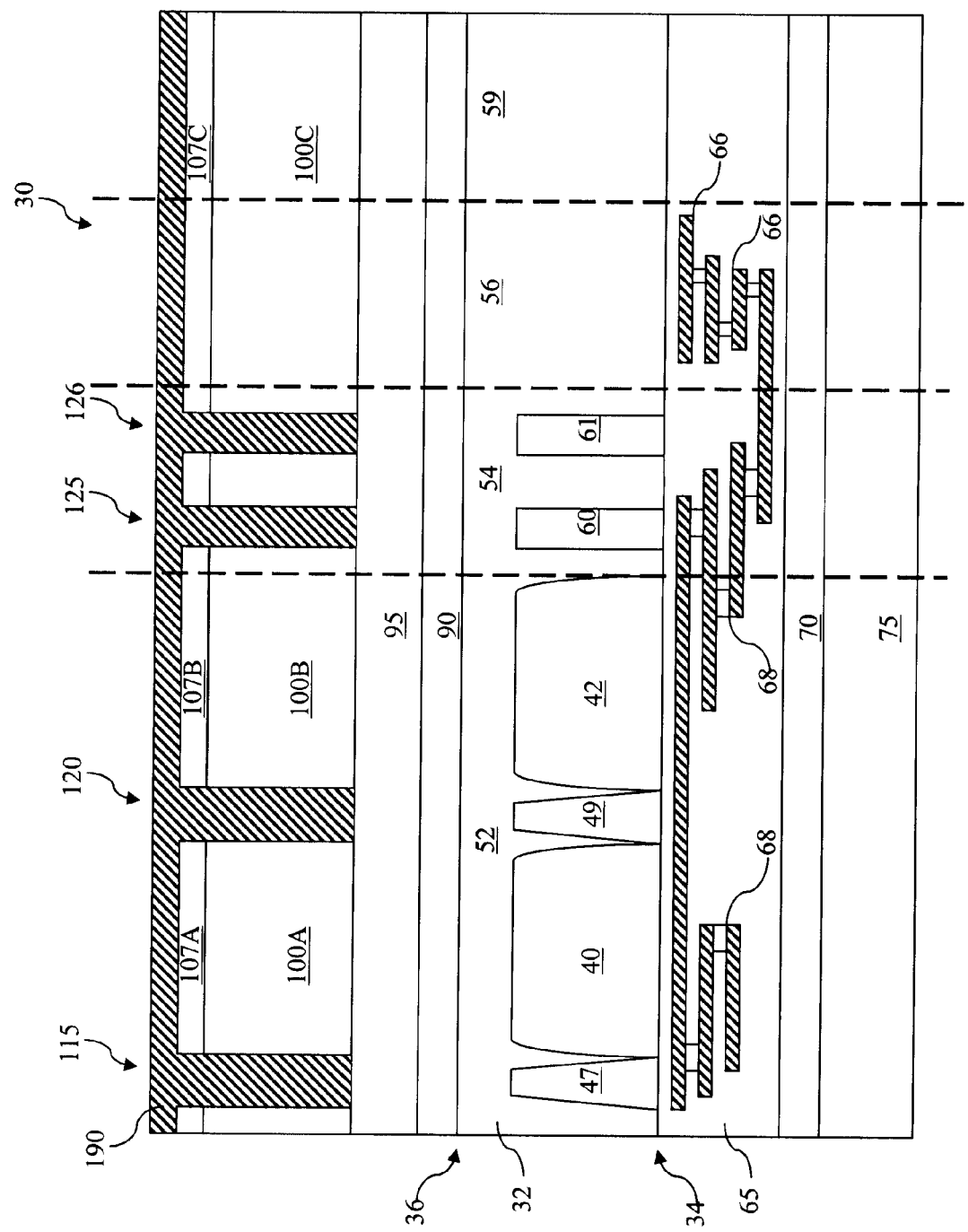

After forming openings in the transparent layer 100 using either the method disclosed in the present embodiment illustrated in FIG. 5 or the method disclosed in the alternative embodiment illustrated in FIGS. 6-7, the processing of the image sensor 30 continues in FIG. 8. Referring to FIG. 8, an opaque material 190 is formed in the openings 115, 120, 125, 126 and on the portions of the ARC layer 107A-107C. The opaque material 190 includes metal, such as aluminum, copper, aluminum-copper, titanium, tantalum, titanium nitride, tantalum nitride, tungsten, or an alloy thereof. The opaque material 190 is formed by a deposition technique known in the art, such as PVD (or sputtering), CVD, or combinations thereof. In other embodiments, the opaque material 190 may be formed by another suitable process and may include an opaque substance other than metal.

Figure 9:
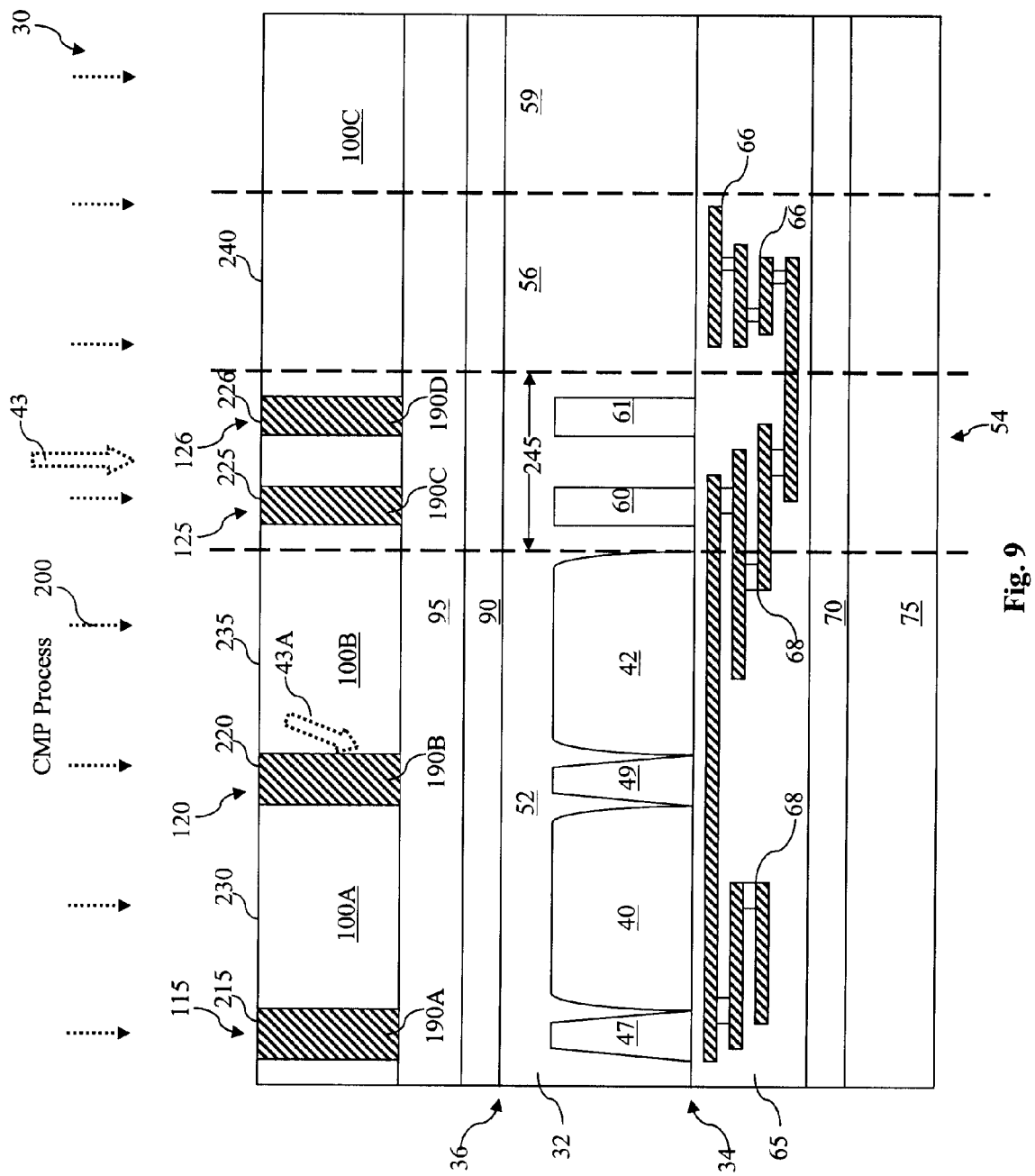

Referring now to FIG. 9, a CMP process 200 is applied on the opaque material 190. The CMP process 200 removes portions of the opaque material as well as the portions of the ARC layer 107A-107C. At the completion of the CMP process 200, portions of the opaque material 190 remaining form opaque features 190A, 190B, 190C, and 190D, which fill the openings 115, 120, 125, and 126, respectively. As is illustrated in FIG. 9, the opaque feature 190A is adjacent to the transparent feature 100A, and the opaque feature 190B is adjacent to the transparent features 100A and 100B. Surfaces 215, 220, 225, and 226 of the opaque features 190A, 190B, 190C, and 190D, respectively, are substantially co-planar with surface 230, 235, 240 of the transparent features 100A, 100B, 100C, respectively. The opaque features 190A and 190B are substantially aligned with the isolation structures 47 and 49, respectively. The opaque features 190C and 190D are substantially aligned with the devices 60 and 61 within the periphery region 54.

The opaque features 190A and 190B reduce optical cross-talk. For example, although the light 43A is intended to be received and absorbed by the pixel 42, the light 43A may propagate toward the pixel 40 due to reasons such as refraction, reflection, or the light 43A being received by the image sensor device 30 at an angle. Without the opaque feature 190B, the light 43A propagates through the transparent layer 100 and may be absorbed by the pixel 40. The absorption of light 43A by the pixel 40 activates electrons in the pixel 40 due to a photoelectric effect and generates a current. However, since the light 43A is not intended to be received by the pixel 40, the generated current is considered noise, which may be referred to as optical cross-talk. In the embodiment shown in FIG. 9, the light 43A is blocked by the opaque feature 190B and may be reflected back so that the light 43A continues to propagate toward the intended pixel-pixel 42. As such, optical cross-talk in the image sensor device 30 is reduced.

The opaque features 190C and 190D enhance the performance of the devices 60 and 61 and reduce noise generated by the devices 60 and 61. Recall from the discussions of FIG. 2 that parts of the periphery region 54 overlying devices 60 and 61 need to be kept optically dark, since the devices 60 and 61 (be it an ASIC circuit device or a reference pixel) suffer performance degradation and/or generate noise when exposed to light. In the embodiment shown in FIG. 9, the opaque features 190C and 190D shield devices 60 and 61 therebelow, respectively, from the light 43, thus achieving optical darkness for devices 60 and 61. Consequently, the noise generated by the devices 60 and 61 is reduced, and the performance of the devices 60 and 61 is enhanced. It is understood that instead of forming two opaque features 190C and 190D, a single opaque feature may be formed to shield both of the devices 60 and 61 from light 43 in an alternative embodiment. For example, the single opaque feature may be large enough to cover substantially all of the periphery region 54. However, if a width 245 of the periphery region 54 is sufficiently large, the single opaque feature formed in the alternative embodiment may have stress therein, for example metal stress. The present embodiment alleviates the potential stress concern by forming two separate opaque features 190C and 190D that have smaller widths. Nevertheless, the alternative embodiment having a single opaque feature is viable in applications where the width 245 of the periphery region 54 is not large enough to raise issues such as metal stress.

Figure 10:
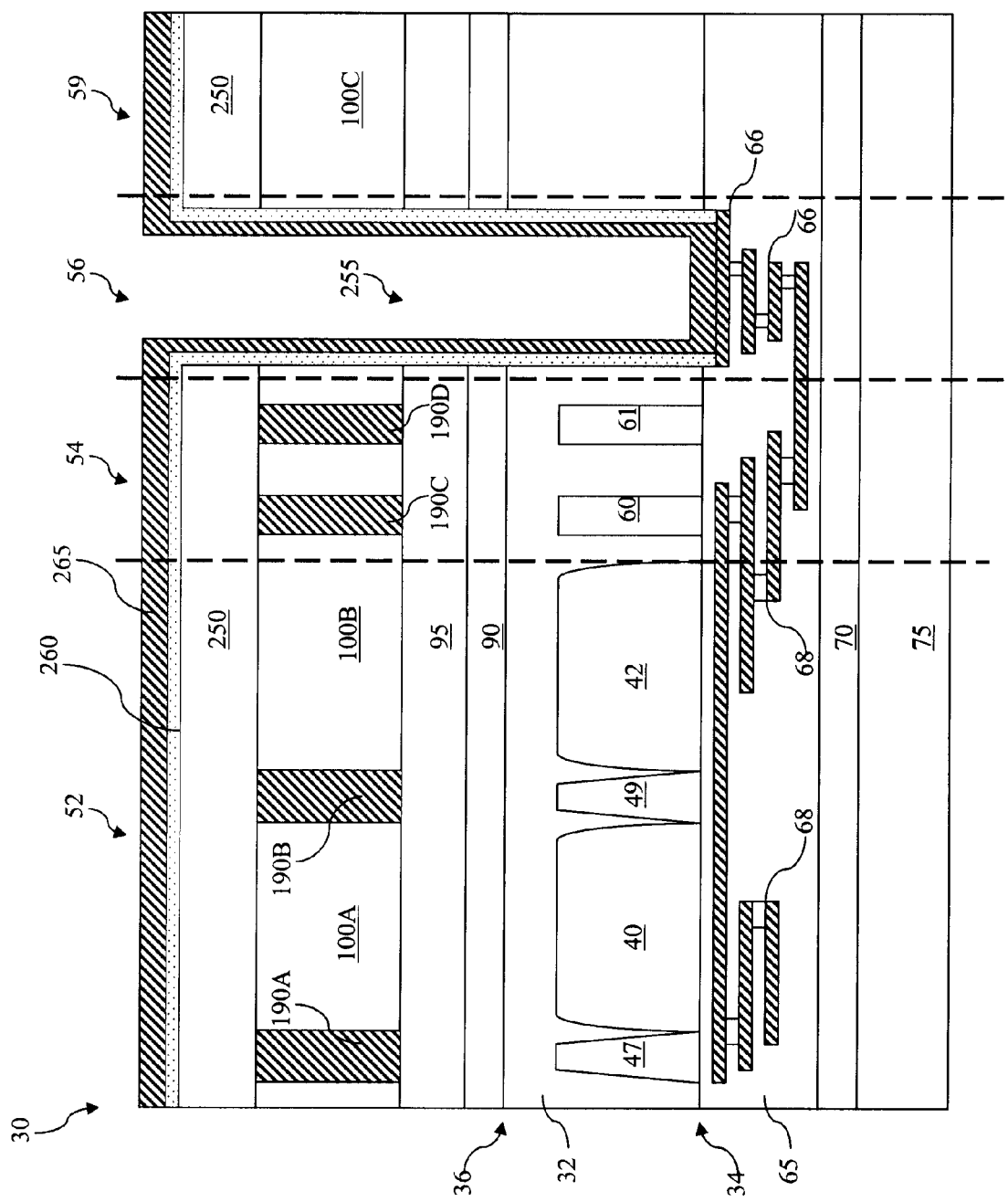

Referring now to FIG. 10, a transparent layer 250 is formed over the opaque features 190A, 190B, 190C, 190D, and the transparent features 100A, 100B, 100C. The transparent layer 250 includes silicon oxide and is formed using a suitable technique in the art, such as CVD, PVD, ALD, or combinations thereof. Thereafter, portions of the materials within the bonding pad region 56 are removed through various etching processes to form an opening 255 that exposes a top most conductive line 66 of the interconnect structure 65 within the bonding pad region 56. A transparent layer 260 is formed on the transparent layer 250 and also partially fills the opening 255. The transparent layer 260 includes silicon oxide and is formed using a suitable technique in the art, such as CVD, PVD, ALD, or combinations thereof. A portion of the transparent layer 260 over the conductive line 66 within the bonding pad region 56 is then etched away using a suitable etching process known in the art, such as a wet etching process or a dry etching process. Thereafter, a conductive layer 265 is formed on the transparent layer 260 and the conductive line 66. The conductive layer 265 includes a metal material, such as aluminum, copper, aluminum-copper, titanium, tantalum, titanium nitride, tantalum nitride, tungsten, or an alloy thereof, and is formed using a suitable technique in the art, such as CVD, PVD, ALD, or combinations thereof. As is illustrated in FIG. 10, the conductive layer 265 comes into contact with the conductive line 66 within the bonding pad region 56. Therefore, electrical connections between the image sensor device 30 and devices external to the image sensor device 30 may be established through the conductive layer 265. It is also understood that the transparent layer 260 isolates the conductive layer 265 from the device substrate 32.

Figure 11:
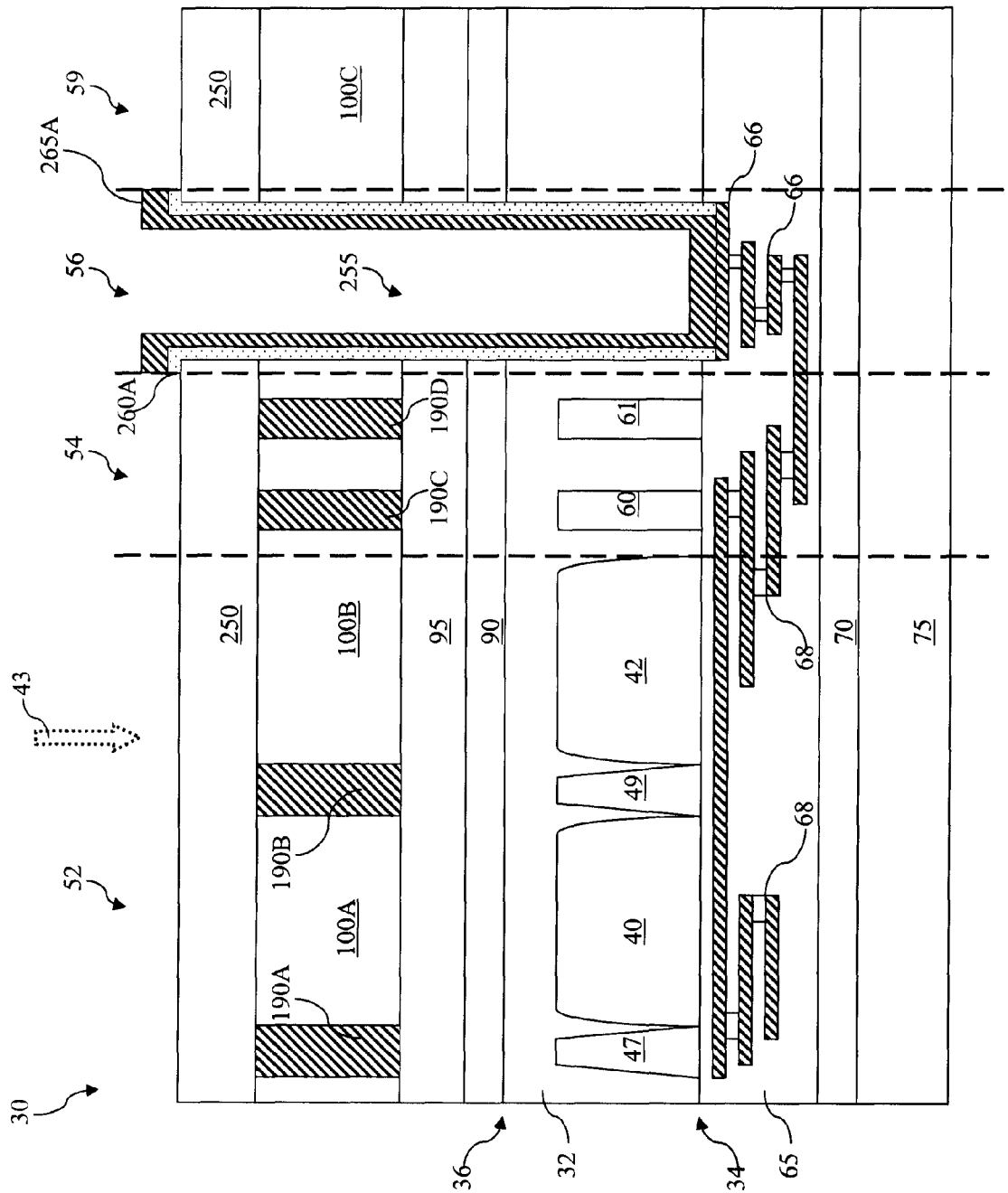

Referring now to FIG. 11, portions of the conductive layer 265 and the transparent layer 260 therebelow that are outside the bonding pad region 56 are removed using various suitable techniques known in the art, such as wet or dry etching processes. A remaining portion of the conductive layer 265 may be referred to as a bonding pad 265A. It is understood that additional conductive materials may be formed over the bonding pad 265A to complete its formation.

Though not illustrated, additional processing is performed to complete the fabrication of the image sensor device 30. For example, color filters are formed within the pixel region 52. The color filters may be positioned such that the light 43 is directed thereon and therethrough. The color filters may include a dye-based (or pigment based) polymer or resin for filtering a specific wavelength band of the light 43, which corresponds to a color spectrum (e.g., red, green, and blue). Thereafter, micro-lenses are formed over the color filters for directing and focusing the light 43 toward specific radiation-sensing regions in the device substrate 32, such as pixels 40 and 42. The micro-lenses may be positioned in various arrangements and have various shapes depending on a refractive index of material used for the micro-lens and distance from a sensor surface. The color filters and the micro-lenses may be formed before or after the formation of the opaque features. It is also understood that the device substrate 32 may also undergo an optional laser annealing process before the forming of the color filters or the micro-lenses.

Figure 12:
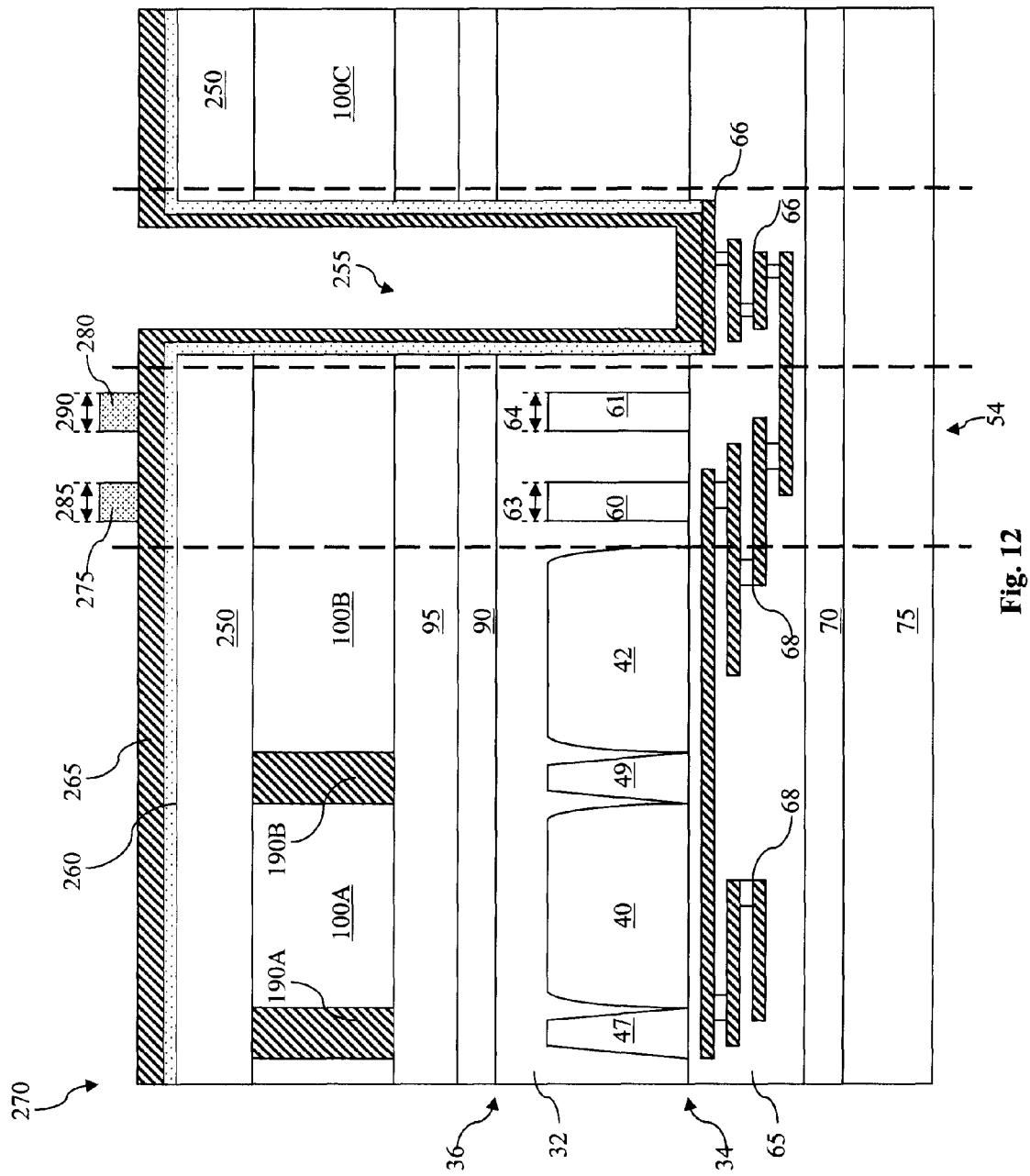
Figure 13:
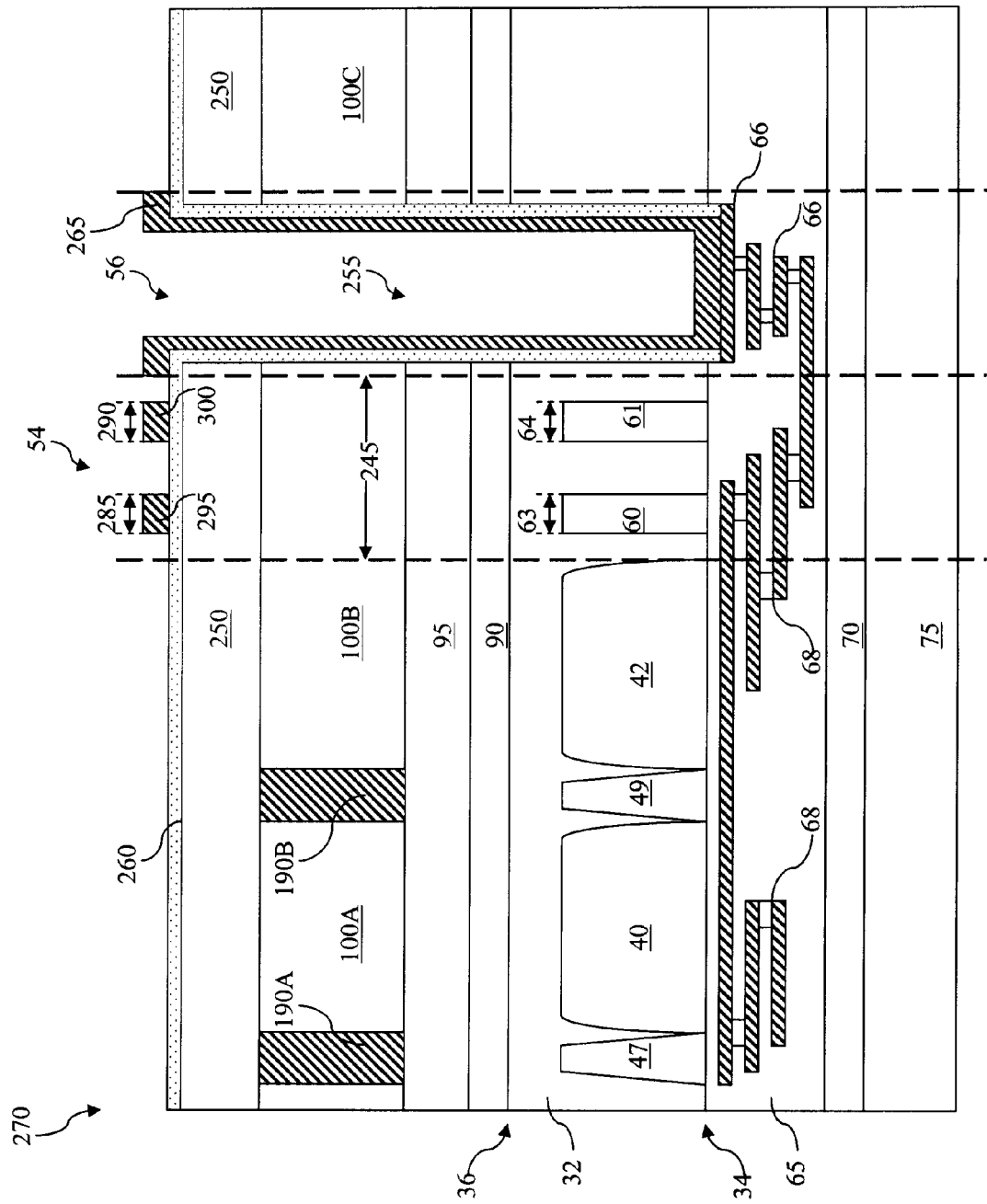

FIGS. 12 to 13 illustrate an alternative embodiment of an image sensor device 270 that uses a different method and structure to shield devices 60 and 61 from the light 43. In the alternative embodiment, no opening is formed within the periphery region 54 of the image sensor device 270, but the image sensor device 270 is otherwise fabricated in accordance with processes discussed above and illustrated in FIGS. 5-10. Referring now to FIG. 12, the conductive layer 265 is formed over the transparent layer 260. The conductive layer 265 is also opaque and prevents the propagation of a light wave therethrough. Thereafter, a photoresist layer is formed over the conductive layer 265 and is patterned by a photolithography process to form photoresist masks 275 and 280 within the periphery region 54. The photoresist masks 275 and 280 are aligned with the devices 60 and 61, respectively. The photoresist masks 275 and 280 also have widths 285 and 290, respectively. The widths 285 and 290 are greater or equal to the widths 63 and 64, respectively.

Referring now to FIG. 13, using the photoresist masks 285 and 290 to protect portions of the conductive layer 265 therebelow, the conductive layer 265 is patterned by a photolithography process to form opaque features 295 and 300, while the rest of the conductive layer 265 outside the bonding pad region 56 is removed. Since the opaque features 295 and 300 are patterned after the photoresist masks 275 and 280, the opaque features 295 and 300 have widths substantially equal to the widths 285 and 290 of the photoresist masks 275 and 280 and are also aligned with the devices 60 and 61. The opaque features 295 and 300 shield the devices 60 and 61 from exposure to light and therefore enhance the performance of the devices 60 and 61 and reduce noise generated by the devices 60 and 61 for the same reasons as discussed previously (refer to discussions for FIG. 9). It is also understood that if the width 245 of the periphery region is not sufficiently large to cause stress concerns, the conductive layer 265 may be patterned to form a single opaque feature in the periphery region to shield the devices 60 and 61 from exposure to light, where the single opaque feature is large enough to cover both of the devices 60 and 61. Also note that the photoresist masks 275 and 280 are removed in a stripping or ashing process known in the art before the formation of the bonding pad continues.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating an image sensor device, comprising:
    providing a device substrate having a front side and a back side;
    forming first and second radiation-sensing regions in the device substrate, the first and second radiation-sensing regions being separated by an isolation structure;
    forming an interconnect structure over the front side of the device substrate;
    forming a transparent layer over the back side of the device substrate;
    forming an opening in the transparent layer, the opening being aligned with the isolation structure;
    partially filling the opening with a further transparent layer to form a reduced opening; and
    filling the reduced opening with an opaque material.

2. The method of claim 1, further including:
    before the forming of the transparent layer, bonding a carrier substrate to the front side of the device substrate;
    performing a chemical mechanical polishing process on the opaque material to form an opaque feature having a surface that is substantially co-planar with a surface of the transparent layer;
    forming a further opening in a bonding pad region of the image sensor device, the further opening extending through the device substrate and exposing the interconnect structure; and
    forming a bonding pad in the further opening, the bonding pad partially filling the further opening and directly contacting the interconnect structure.

3. The method of claim 1, wherein the forming of the opening includes forming a further opening in the transparent layer, the opening being formed in a pixel region of the image sensor device, and the further opening being formed in a periphery region of the image sensor device.

4. The method of claim 3, wherein the filling of the opening includes filling the further opening with the opaque material, wherein the opaque material includes metal.

5. The method of claim 3, further including:
    forming a periphery device in the device substrate and within the periphery region;
    wherein the forming of the further opening is carried out so that the further opening has a width that is not less than a width of the periphery device.

6. The method of claim 1, wherein the forming of the opening is carried out so that the opening extends vertically through the transparent layer.

7. The method of claim 1, wherein the forming of the opening is carried out so that a width of the opening is approximately equal to a width of the isolation structure.

8. The method of claim 1, where a width of the reduced opening is approximately equal to a width of the isolation structure.

9. A method of fabricating an image sensor device, comprising:
    providing a device substrate having a front side and a back side;
    forming a radiation-sensing region in the device substrate;
    forming an interconnect structure over the front side of the device substrate;
    forming a transparent layer over the back side of the device substrate;
    patterning the transparent layer to form a transparent feature that is substantially aligned with the radiation-sensing region and an opening that is adjacent to the transparent feature;
    reducing a lateral dimension of the opening, thereby forming a reduced opening; and
    filling the reduced opening with an opaque material.

10. The method of claim 9, further including performing a chemical mechanical polishing process on the opaque material to form an opaque feature having a surface that is substantially co-planar with the transparent feature.

11. The method of claim 10, further including:
    forming a periphery device in a periphery region of the image sensor device;
    before the forming of the transparent layer, forming an isolation structure adjacent to the radiation-sensing region;
    after the forming of the opaque feature, forming a further opening in a bonding pad region of the image sensor device;
    forming a metal layer over the transparent feature and the opaque feature, the metal layer partially filling the further opening; and
    patterning the metal layer to form a further opaque feature aligned with the periphery device and to define a bonding pad partially filling the further opening;
    wherein the forming of the isolation structure and the radiation-sensing region are carried out so that the isolation structure and the radiation-sensing region are formed in a pixel region of the image sensor device, and wherein the patterning of the transparent layer is carried out so that the opaque feature is substantially aligned with the isolation structure.

12. The method of claim 9, further including: forming an isolation structure in the device substrate, the isolation structure being formed adjacent to the radiation-sensing region;

and wherein the patterning the transparent layer is carried out in a manner so that the opening is at least partially aligned with the isolation structure.

13. The method of claim 9, further including:
bonding a carrier substrate to the front side of the device substrate; and
thinning the device substrate from the back side.

14. A method, comprising:
providing a first substrate having opposite first and second sides;
forming an isolation structure in the first substrate, the isolation structure being formed from the first side and extends toward the second side;
forming first and second radiation-sensing regions in the first substrate, the first and second radiation-sensing regions being separated by the isolation structure;
bonding a second substrate to the first side of the first substrate;
thinning the first substrate from the second side;
forming a layer over the second side of the first substrate;
forming an opening in the layer, the opening being at least partially aligned with the isolation structure;
partially filling the opening with a transparent material, thereby reducing a width of the opening; and
thereafter filling the opening with a non-transparent material.

15. The method of claim 14, wherein the forming the layer is carried out in a manner so that the layer includes a transparent material.

16. The method of claim 14, wherein the filling the opening is carried out in a manner so that the non-transparent material includes a metal.

17. The method of claim 14, wherein the forming the opening is carried out in a manner so that the opening has a width that is no smaller than a width of the isolation structure.

18. The method of claim 14, wherein the forming the opening includes forming at least one additional opening in a periphery region of the second substrate.

* * * * *